United States Patent [19]
Xiberas

[11] 4,359,038
[45] Nov. 16, 1982

[54] ELECTRONIC IGNITION-COIL CONTROL DEVICE FOR AN INTERNAL COMBUSTION ENGINE

[75] Inventor: Andre Xiberas, Paris, France

[73] Assignee: Groupement d'Interet Economique de Recherches et de Developpement PSA, Paris, France

[21] Appl. No.: 188,493

[22] Filed: Sep. 18, 1980

[30] Foreign Application Priority Data

Sep. 21, 1979 [FR] France .................................. 79 23602

[51] Int. Cl.³ .............................................. F02P 3/04
[52] U.S. Cl. .................................. 123/644; 123/651; 315/209 T
[58] Field of Search .................... 123/644, 651, 652; 315/209 T; 361/86

[56] References Cited

U.S. PATENT DOCUMENTS

| | | | |
|---|---|---|---|
| 4,114,582 | 9/1978 | Rabus et al. | 123/644 |
| 4,117,819 | 10/1978 | Jarrett et al. | 123/644 |
| 4,153,031 | 5/1979 | Kalkhof | 315/209 T |
| 4,153,032 | 5/1979 | Chateau | 123/644 |

Primary Examiner—Ira S. Lazarus
Assistant Examiner—Andrew M. Dolinar
Attorney, Agent, or Firm—Oblon, Fisher, Spivak, McClelland & Maier

[57] ABSTRACT

The primary winding of an ignition coil is placed in series with the collector of a switching transistor. In order to protect the transistor against overvoltages, the collector is also connected to a level comparator and the base receives a two-state control signal which is synchronous with the rotation of the engine. One input of the comparator is connected through a divider network to the collector of the transistor and the outer input is connected to a fixed direct-current voltage source. Provision is also made for an error amplifier connected to the output of the comparator, and for a summing circuit which is connected to the control input of the transistor and receives the control signal.

5 Claims, 2 Drawing Figures

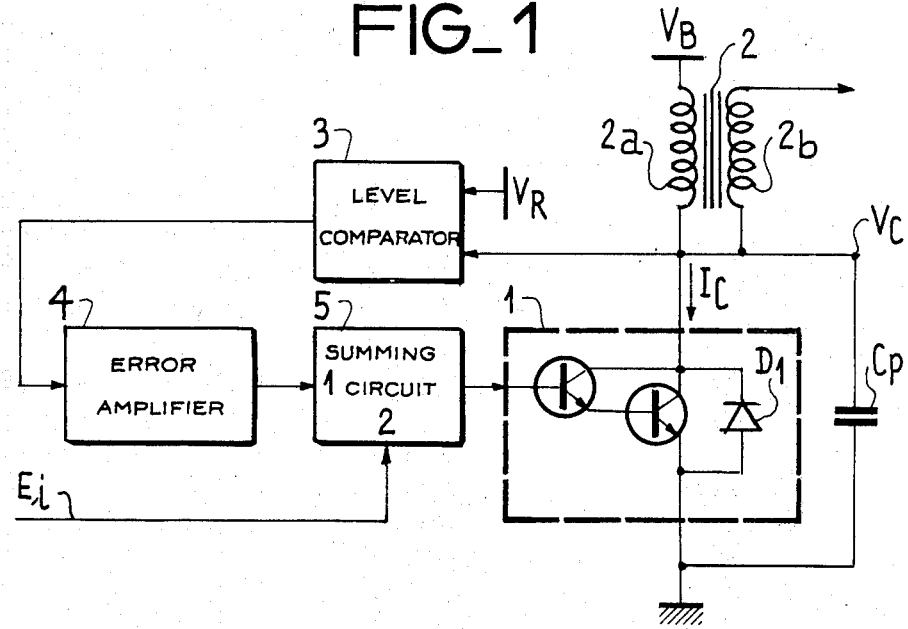
FIG_1
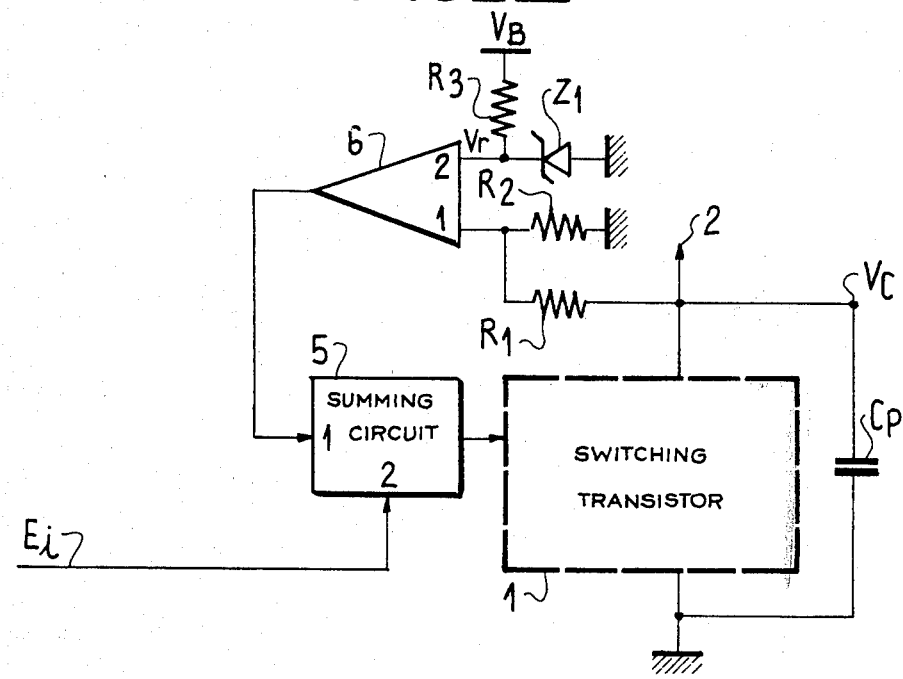
FIG_2

ELECTRONIC IGNITION-COIL CONTROL DEVICE FOR AN INTERNAL COMBUSTION ENGINE

BACKGROUND OF THE INVENTION

1. Field of the Invention

This invention relates to the technique of electronic ignition systems of the inductive type for internal combustion engines. In more precise terms, the invention is concerned with an electronic device for controlling the magnetizing current which flows through the primary winding of the ignition coil, a protective circuit being provided in said device for guarding against overvoltages which are encountered under service conditions or which occur accidentally.

2. Description of the Prior Art

A conventional ignition system makes use of an electromechanical contact-breaker, the main disadvantages of which are well known: rapid electrical erosion of contacts under heavy loads, constant closing factor limited by the speed of mechanical opening of contacts, contact-bounce phenomena related to characteristics of mechanical resonance of resilient contact-strips.

In order to overcome the above-mentioned disadvantages of the electromechanical breaker, it has now become a common practice to replace this design by an electronic control device which is not subject to the inherent disadvantages of electromechanical devices. In the case of an electronic device which utilizes a switching transistor, the primary winding of the ignition coil is placed in series with the collector of the transistor and control of the magnetizing current is effected by switching the transistor alternately from the saturating mode in which it is fully turned-on to the nonsaturating mode in which it is fully turned-off. Control of this power switching transistor is usually performed by means of an electronic transducer whilst the means for producing automatic ignition advance can be either of the mechanical type or of the electronic type.

Despite the advantages attached to the use of a switching transistor, it would be unwise to lose sight of the practical limitations resulting from the characteristics of junctions in semiconductors, especially the collector-breakdown d.c. voltage. When the transistor is turned-off, the overvoltage which appears at the terminals of the primary winding undoubtedly depends on the value of the tuning capacitor connected to the terminals of the transistor but is also directly dependent on the load impedance of the secondary winding: spark resistance and spark-plug fouling resistance or else open-circuit resistance resulting from occasional or accidental disconnection of one or a number of spark plugs.

In order to ensure operational safety of the switching transistor, the terminal voltage of said transistor must be limited to a maximum value which is specified for the type of transistor employed. With this objective, it is necessary to adopt means which provide effective protection against overvoltages, taking into account the fast overvoltage rise time (10 to 20 μs) and the peak voltages developed (350 to 500 volts). The protection means now in universal use essentially consist of a Zener diode connected between the collector of the transistor and the control input of said transistor, the knee voltage of said Zener diode being lower than the breakdown voltage of the transistor. The signal appearing at the terminals of the secondary winding of the ignition coil must be capable of attaining a value of the order of 30 kV during normal service. Taking into account the coil transformation ratio of the order of 60 to 100, the value of the signal at the terminals of the primary winding, that is, on the collector of the transistor, is of the order of 300 to 500 V. The knee voltage of the protective Zener diode must be comprised between this value of 300 to 500 V and the breakdown voltage of the transistor. In actual practice, said protective Zener diode must in fact be constituted by two Zener diodes, the knee voltage of which is located in the vicinity of 200 V.

This means of protection by Zener diode suffers from a number of drawbacks: current technologies do not permit integration of Zener diodes with the switching transistor since the temperature coefficient of these diodes varies in inverse ratio to that of the transistor, and the knee voltage of Zener diodes in the category of 200 V and above is widely dispersed. These disadvantages are attended by the following consequences: dispersion of electrical characteristics of control devices and a narrow margin of protection.

The aim of the invention is to overcome the disadvantages of devices protected by Zener diodes in accordance with the prior art. A further aim of the invention is to integrate the protection means with the switching transistor.

SUMMARY OF THE INVENTION

Accordingly, the invention is directed to a device for controlling the magnetizing current which flows through the primary winding of the ignition coil. This device comprises a switching transistor in which the collector is connected to the primary winding and the base receives a two-state control signal which is synchronous with the rotation of the engine and a protection means constituted by a level comparator, the first input of said comparator being connected through a dividing network to the collector of said transistor and the second input being connected to a fixed direct-current voltage source. The device further comprises an error amplifier connected to the output of said comparator, a summing circuit which is connected to the control input of the transistor and which receives the two-state control signal.

A switching transistor should be understood to mean either a single transistor or, in a broader sense, a combination of a plurality of transistors. The secondary winding of the ignition coil can be either of the type having a single output or of the type having symmetrical outputs without thereby modifying the operation of the device in any respect.

BRIEF DESCRIPTION OF THE DRAWINGS

These and other features of the invention will be more apparent to those skilled in the art upon consideration of the following description and accompanying drawings, in which:

FIG. 1 is a block diagram showing a control device in accordance with the invention;

FIG. 2 is a block diagram showing one embodiment of a control device of FIG. 1.

DESCRIPTION OF THE PREFERRED EMBODIMENT

FIG. 1 illustrates in the form of a block diagram a control device in accordance with the invention and comprising the following elements:

a switching transistor 1 arranged in a Darlington circuit connection, for example, is placed in series with the primary winding 2a of an ignition coil 2, the secondary winding 2b of said coil being connected to the spark plugs of the engine; the diode $D_1$ is a transistor element for providing protection against reverse voltages; and the element $C_p$ is the shunt capacitor of the circuit;

a level comparator 3, the first input of said comparator being connected to the junction point of the transistor 1 and to the primary winding 2a of the ignition coil and the second input of said comparator being connected to a direct-current reference voltage source $V_R$ of the order of a few volts;

an error amplifier 4 connected to the output of the comparator aforesaid;

a summing circuit 5, the first input of said circuit being connected to the output of the amplifier aforesaid and the second input of said summing circuit being adapted to receive a two-state control signal $E_i$ which is synchronous with the rotation of the engine; this circuit can be a simple resistive network.

The operation of this control device is as follows: when the control signal $E_i$ is at the top level, the transistor 1 is in the saturated state and a current $I_c$ delivered by the electric power source $V_B$ flows through the ignition coil 2. When the signal $E_i$ undergoes a transition to the bottom level, the transistor 1 is triggered into the nonconducting state; from this instant, the voltage $V_C$ at the terminals of the capacitor $C_p$ rises sharply. This voltage $V_C$ is compared with the reference voltage $V_R$ after scaling by a factor k using a divider network (not shown in FIG. 1); if the condition $kV_c$ higher than $V_R$ occurs, a current is injected in the base of the transistor 1 which reverts to the conducting state and maintains the voltage rise $V_c$ below the breakdown voltage of said transistor. The operation of the device is identical when the spark plugs are disconnected.

FIG. 2 illustrates in the form of a block diagram one embodiment of a control device in accordance with the invention. The elements 1, 2 and 5 are identical with those of FIG. 1; the level comparator 3 and the amplifier 4 are combined in the form of a differential amplifier 6, the divider network is constituted by the resistors $R_1$ and $R_2$ and the reference voltage $V_R$ is delivered by a Zener diode $Z_1$ connected to the voltage source $V_B$ through a resistor $R_3$. The operation of the device of FIG. 2 remains identical with the operation of FIG. 1.

The elements which constitute the protection means can be integrated with the switching transistor by means of the technologies currently employed in the fabrication of integrated circuits.

The advantages offered by a control device in accordance with the invention will now be more readily apparent. In particular, all the elements constituting the device can be integrated on a semicondutor substrate, the value of maximum overvoltage can easily be adjusted by modifying the value of the division coefficient k, electrical reliability is enhanced, and the cost of the device is substantially reduced.

Certain modifications can be made in the device hereinabove described without thereby departing from the scope of the invention. For example, the reference voltage $V_R$ can be obtained directly from a stabilized direct-current voltage source and from a resistive divider.

In general terms, the invention finds applications in control devices involving the use of switching transistors which operate on an inductive load, or a transformer whose load impedance is liable to vary. More specifically, the invention finds a particular application in the automobile industry.

What is claimed is:

1. An ignition-coil control device for an internal combustion engine having an ignition-coil with a primary and a secondary winding, a switching transistor in which a collector thereof is connected to the primary winding of the ignition-coil and a base of the transistor receives a two state control signal from an electronic transducer which signal is synchronous with the rotation of the engine to either turn-off or turn-on said transistor, said control device comprises in series-connected relation:

a level comparator having a first input connected through a divider network to the collector of said switching transistor and having a second input connected to a fixed direct-current voltage source and providing an output in response to the voltage at the collector of said switching transistor;

an error amplifier connected to the output of said level comparator;

a summing circuit which receives the output of said error amplifier and said two-state control signal in order to protect said transistor from overvoltage occuring during operation by regulating the current which flows through the primary winding of said ignition coil.

2. A control device according to claim 1, wherein the level comparator and the error amplifier are constituted by a differential amplifier having a first input connected through said divider network to the collector of the switching transistor and having a second input connected to said fixed direct-current voltage source.

3. A control device according to claim 1, wherein the divider network is of the resistive type.

4. A control device according to claim 1, wherein a low-voltage Zener diode supplies said fixed direct-current voltage.

5. A device according to claim 1, wherein the elements constituting said device are fabricated in the form of an integrated-circuit.

* * * * *